United States Patent
Bouvier

(10) Patent No.: US 6,774,727 B2
(45) Date of Patent: Aug. 10, 2004

(54) DEVICE COMPRISING A SYMMETRICAL AMPLIFIER

(75) Inventor: Stephane Bouvier, Cairon (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/321,205

(22) Filed: Dec. 17, 2002

(65) Prior Publication Data

US 2003/0155979 A1 Aug. 21, 2003

(30) Foreign Application Priority Data

Dec. 20, 2001 (FR) .............................. 01 16574

(51) Int. Cl.$^7$ .............................. H03F 3/08; H03F 1/02; H03G 3/10
(52) U.S. Cl. .............................. 330/308; 330/9; 330/278
(58) Field of Search .............................. 330/308, 9, 278

(56) References Cited

U.S. PATENT DOCUMENTS

| | | | |
|---|---|---|---|
| 4,565,974 A | * 1/1986 | Smoot | 330/304 |
| 5,636,048 A | 6/1997 | Kogure et al. | 359/189 |
| 5,812,030 A | * 9/1998 | Inami et al. | 330/308 |
| 6,084,478 A | 7/2000 | Mayampurath | 330/308 |
| 6,242,732 B1 | * 6/2001 | Rantakari | 250/214 A |
| 6,297,701 B1 | * 10/2001 | Visocchi et al. | 330/308 |
| 6,359,517 B1 | * 3/2002 | Colaco | 330/308 |
| 6,583,671 B2 | * 6/2003 | Chatwin | 330/279 |

\* cited by examiner

*Primary Examiner*—Patricia Nguyen
(74) *Attorney, Agent, or Firm*—Aaron Waxler

(57) ABSTRACT

This device finds interesting applications in the field of interface circuits for optical fibers. There is proposed in this circuit to utilize a symmetrical amplifier (19) to which an automatic gain control circuit (27) is added which is insensitive to variations of the offset voltage of this amplifier. This control circuit (27) comprises peak detectors which give the best results in a circuit of this type intended for processing signals at very high frequencies.

2 Claims, 2 Drawing Sheets

DEVICE COMPRISING A SYMMETRICAL AMPLIFIER

The invention relates to a device comprising a symmetrical amplifier which has, inter alia, at least one input terminal for receiving a voltage to be amplified, a pair of output terminals for producing a symmetrical amplified voltage, and a symmetrical amplifier circuit having inputs for being connected to said input terminal, and outputs for being connected to said output terminals, and also a gain control for receiving a gain control signal.

The invention finds interesting applications notably in the field of optical fibers which transmit at a very rate (~10 Gbits/s). In this field a transformation is to be provided which adapts the signals transported by the optical fiber to signals intended for a line of electric wires. This transformation implies symmetrical types of amplifications. Reference may be made to the instructions for use of the component TZA3013A manufactured by Philips. To obtain a proper conversion of the signals for said electric wire line, it is known practice that the amplitude of the signals is to be properly regulated. A good quality for this regulation is hard to obtain because it is difficult to have a good measurement of the amplitude of the signals on the output of the symmetrical amplifier at the working frequencies considered, this measurement being affected by offset voltage variations which are due to inter alia thermal drift and ageing.

The present invention proposes a device of the type mentioned in the opening paragraph which permits to have a constant amplitude gain of the signals intended for the electric wires even if a variation of the offset voltage occurs.

For this purpose such a device is characterized in that said amplifier furthermore includes a circuit for measuring the amplitude of signals to produce said gain control signal, which circuit is formed by amplitude detectors of the same type, connected to produce measurements which represent the amplitude of electrical magnitudes at said output terminals.

The inventive idea comprises the use of detectors of the same type, for example, peak detectors for measuring the amplitude of the signals on the symmetrical outputs of the amplifier and not by a peak detector for an output and a valley detector. These detectors involve transistors of different types with which it is difficult to match the electrical characteristics.

These and other aspects of the invention are apparent from and will be elucidated, by way of non-limitative example, with reference to the embodiments described hereinafter.

Figure 1:
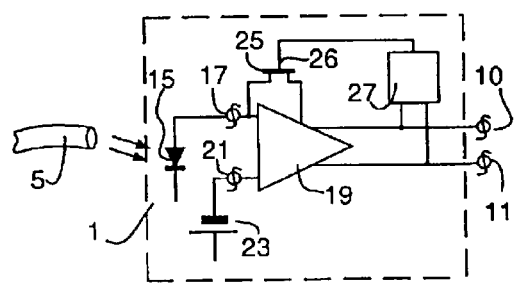
FIG. 1 shows a device in accordance with the invention.

FIG. 1 shows a device in accordance with the invention referred to as 1. This device is within the framework of the example, an interface circuit for an optical fiber 5 transmitting data. These data are supplied in the form of symmetrical signals on the output terminals 10 and 11. The light radiation of the optical fiber 5 is analyzed by a PIN diode 15. The voltage variations on the electrodes of this diode are applied to an input terminal 17 of a differential amplifier 19. The other input terminal 21 is connected to a voltage source 23 whose value determines a threshold for the detection of data coming from the diode 15. According to the value of this received signal it is necessary to amplify it more or less for a later processing. To regulate this amplification, a feedback resistor formed by a field effect transistor 25 is acted on which receives a variable gain control voltage produced by a gain control circuit 27. This variable gain control, referred to as 26, is formed by the gate of this transistor 25.

Figure 2:
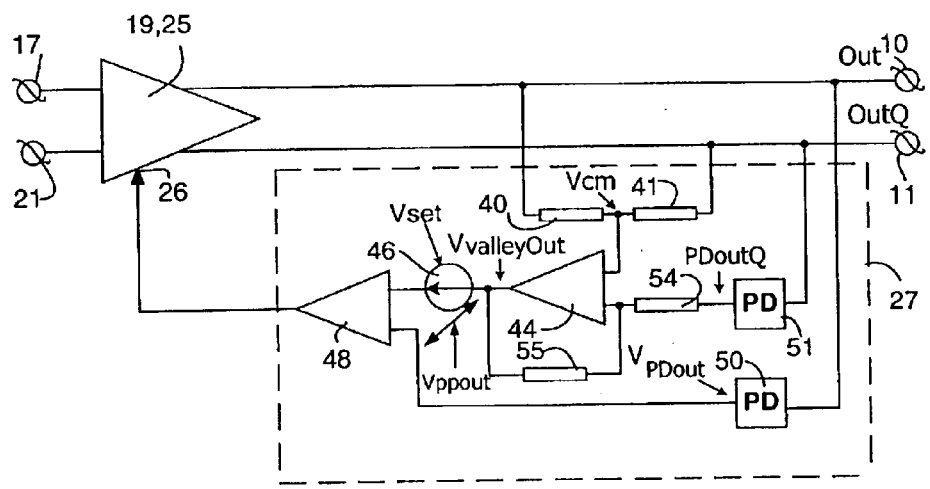
FIG. 2 shows an amplifier forming part of the device in accordance with the invention.

FIG. 2 shows in more detail this gain control circuit 27 which is not influenced by the offset voltage variations of the amplifier 19. This control circuit comprises a measuring point of the median voltage on terminals 10 and 11. It is formed by a series combination of two resistors 40 and 41 arranged between the two terminals 10 and 11. The common point of these two resistors is connected to the first input of an amplifier 44 whose output is connected to a voltage source 46 which superimposes a voltage Vset on the output voltage of the amplifier 44. This superimposed voltage is applied to the first input of a second amplifier 48 whose output is applied to the input of the variable gain control 26. According to one of the characteristics of the invention, the second inputs of the amplifiers 44 and 48 are connected to the outputs of two amplitude detectors 50 and 51, respectively, which measure the voltages on terminals 10 and 11. The output of the detector 50 is connected directly to the second input of the amplifier 48, whereas that of the detector 51 is connected to the second input of the amplifier 44 via a feedback network formed by two resistors 54 and 55 having the same value. The output of the detector 51 is connected to one end of the resistor 54 whose other end is connected to this second input of the amplifier 44. The second resistor 55 interconnects the output with the second input of the amplifier 44.

Figure 3:
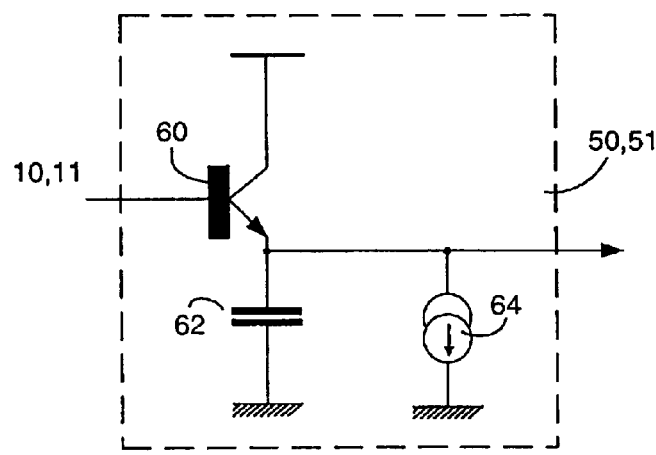
FIG. 3 shows an amplitude detector utilized in the amplifier according to the invention.

FIG. 3 shows in detail how the amplitude detectors 50 and 51 are formed. They comprise a transistor 60 whose base forms the input of this detector, a capacitor 62 which is connected between the emitter of this transistor and ground, the collector of this transistor being connected to a potential having an appropriate fixed value, and a current generator 64 whose aim is to discharge the capacitor 62 with constant current.

Figure 4:
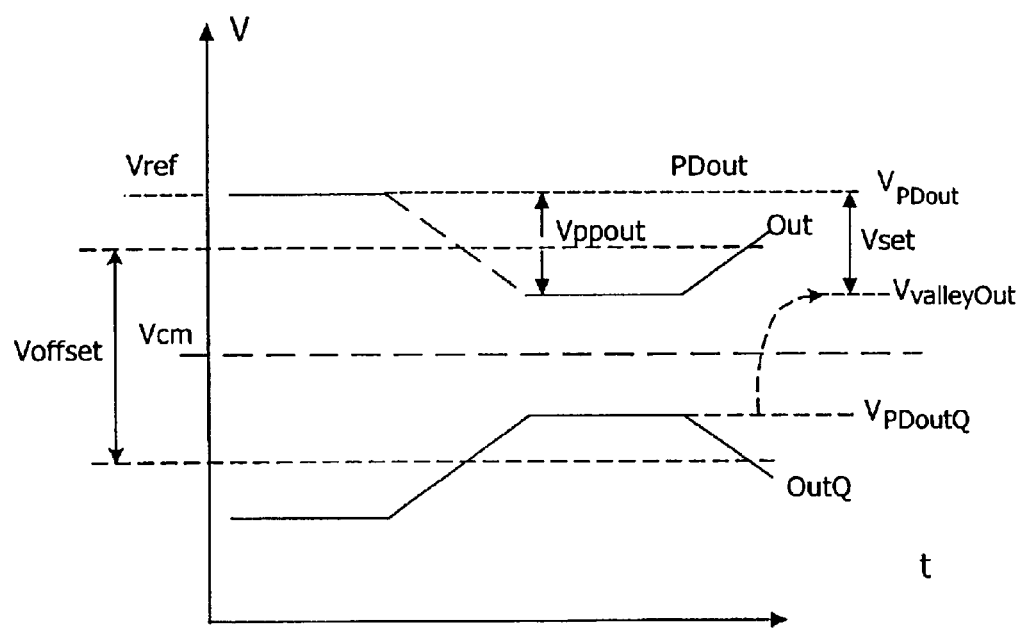
FIG. 4 shows a timing diagram intended for the explanation of the invention.

In that which follows the operation of the gain control circuit 27 (FIG. 4) will be explained:

Out is the output voltage of the amplifier 19 on terminal 10, $V_{Pdout}$ is the value of the peak voltage measured by the detector 50 corresponding to this voltage Out, OutQ is the output voltage of the amplifier 19 on terminal 11, $V_{PdoutQ}$ is the value of the peak voltage measured by the detector 50 corresponding to this voltage Out, Vset is the set value for the amplitude of the signals Out and OutQ to remain slaved to this value, Vppout is the amplitude of the output signal that is to be slaved to Vset, $V_{valleyOut}$ is the peak value according to a valley detector. It is obtained by the detector 51 and the inverting amplifier 44 for the output voltage of this detector 51. This is obtained via the same value of the resistors 54 and 55 and also via the application of one of its inputs of the voltage of the node between the resistors 40 and 41.

Voffset is the offset voltage that may vary as a function of time, this voltage represents the voltage offset which separates the mean level of the output signals of the signals Out and OutQ.

It is thus possible to show that:

$$V_{pp}\text{Out} = V\text{peak} - V\text{valley} = V\text{set}$$

In this formula Vpeak is the maximum value of the voltage given by a peak detector connected to an output (10) and Vvalley would be the value of the minimum amplitude of the signal on the output (11).

This formula very well shows that the amplitude Vppout remains fixed at the value Vset and that the offset voltage Voffset does not occur. The invention thus creates this signal Vvalley by utilizing a peak detector 51 in combination with the amplifier 44 and its feedback network so as to form a minimum-value simulation circuit.

What is claimed is:

1. A device comprising a symmetrical amplifier which has, inter alia, at least one input terminal for receiving a voltage to be amplified, a pair of output terminals for producing a symmetrical amplified voltage, and a symmetrical amplifier circuit having inputs for being connected to said input terminal, and outputs for being connected to said output terminals, and also a gain control for receiving a gain control signal, characterized in that said amplifier furthermore includes a circuit for measuring the amplitude of signals to produce said gain control signal, which circuit is formed by amplitude detectors of the same type, connected to produce measurements which represent the amplitude of electrical magnitudes at said output terminal, wherein said detectors are peak detectors of which one detector is connected to one of the outputs and the other to the other output, a minimum-value simulation circuit being inserted at the output.

2. A device as claimed in one of the claim 1, characterized in that it comprises interfaces for being connected to an optical fiber line.

* * * * *